(12) United States Patent
Shih

(10) Patent No.: US 6,643,732 B1
(45) Date of Patent: Nov. 4, 2003

(54) DELAYED READ/WRITE SCHEME FOR SRAM INTERFACE COMPATIBLE DRAM

(75) Inventor: Jeng-Tzong Shih, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 70 days.

(21) Appl. No.: 09/992,519

(22) Filed: Nov. 14, 2001

(51) Int. Cl.[7] ............... G06F 12/00; G06F 1/04; G06F 11/00; G11C 7/00
(52) U.S. Cl. ............... 711/106; 365/222; 713/503; 711/105
(58) Field of Search ................ 711/106, 105; 365/222; 713/503

(56) References Cited

U.S. PATENT DOCUMENTS

| | | | |
|---|---|---|---|
| 5,991,851 A | 11/1999 | Alwais et al. | 711/106 |
| 5,999,474 A | 12/1999 | Leung et al. | 365/222 |
| 6,028,804 A | 2/2000 | Leung | 365/222 |
| 6,388,934 B1 * | 5/2002 | Tobita | 365/222 |
| 6,459,650 B1 * | 10/2002 | Lin | 365/233 |
| 2002/0147885 A1 * | 10/2002 | Mobley | 711/106 |

FOREIGN PATENT DOCUMENTS

EP 0273652 A2 * 6/1988 ............ G11C/11/24

* cited by examiner

Primary Examiner—Kimberly N. McLean-Mayo
(74) Attorney, Agent, or Firm—George O. Saile; Stephen B. Ackerman; Douglas R. Schnabel (57) ABSTRACT

A method of internally executing an externally initiated access to a dynamic memory array including a plurality of dynamic memory cells, wherein the dynamic memory cells require periodic refreshing, is achieved. The method comprises, first, determining if an external access to the dynamic memory array has been initiated. Second, a waiting period of RW idle time is inserted. The RW idle time comprises a sum of a row access time plus a pre-charge time. A pending refresh is performed during said RW idle time. A pending write access may be performed during the RW idle time. Finally, the external access is internally executed in the dynamic memory array after the RW idle time.

19 Claims, 7 Drawing Sheets

REFRESH PENDING

WRITE PENDING

DELAYED READ/WRITE SCHEME FOR SRAM INTERFACE COMPATIBLE DRAM

BACKGROUND OF THE INVENTION (1) Field of the Invention

The invention relates to a SRAM interface compatible DRAM, and more particularly, to a method and a circuit for internally executing an externally initiated access to a dynamic memory array including a plurality of dynamic memory cells where the dynamic memory cells require periodic refreshing.

(2) Description of the Prior Art

Dynamic or DRAM memory devices comprise an array of cells that typically comprise a single access transistor and a capacitor. By comparison, static or SRAM memory devices comprise an array of multiple transistor cells, typically comprising 4 or 6 transistors. For this reason, DRAM memory devices are significantly smaller, and therefore less expensive, than SRAM devices for the same memory capacity. However, SPAM devices have lower current consumption since the DRAM cell capacitors must be frequently refreshed to hold their memory state.

It is desirable, from a cost reduction standpoint, to use DRAM memory devices rather than SRAM devices. For example, it is desirable to replace the low power SRAM in a portable electronics system or cell phone with a DRAM to reduce chip or system size and cost. To facilitate the substitution of DRAM for SRAM, with minimal impact on performance, the DRAM device must overcome three problems. First, the internal refresh operations must be transparent to the external operations of the device. Second, the current consumption must be minimized, especially by eliminating unnecessary internal read/write operations. Third, the external access operations on the DRAM must be made compatible with those of a standard SRAM, and particularly the asynchronous SRAM, with very predictable results.

Figure 1:
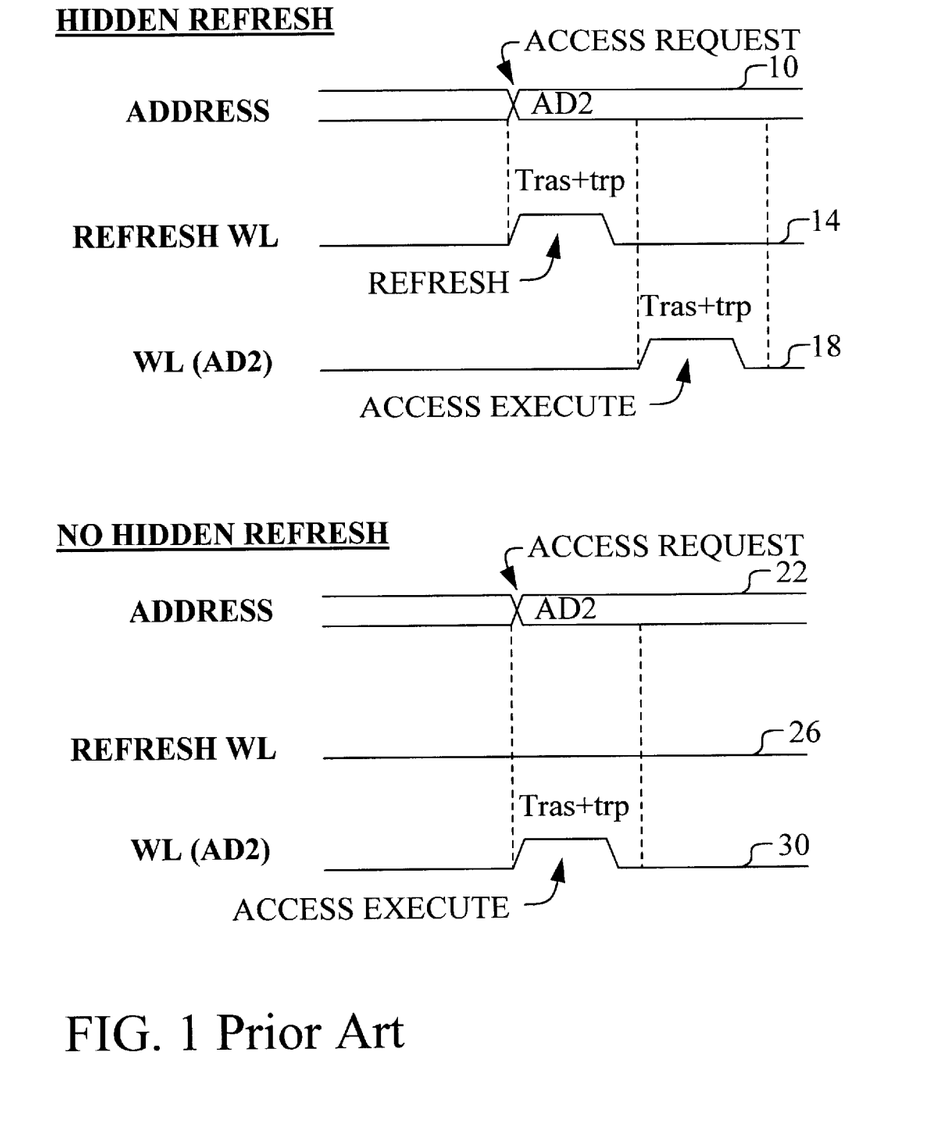
FIG. 1 illustrates a prior art example of the performance of a DRAM memory array device interfaced to SRAM compatible signals and, particularly, illustrating the DRAM performance during a refresh and a non-refresh.

Referring now to FIG. 1, timing diagrams of the operation of a prior art DRAM memory device in a SRAM compatible condition are shown. Two operational cases are shown. In the bottom case, an external access is initiated when no internal or hidden refresh is pending. In the top case, a hidden refresh is pending when an external access of a memory location is initiated. In particular, referring to the lower or NO HIDDEN REFRESH case, the external address bus ADDRESS 22 transitions states to the address AD2. This transition is interpreted by the DRAM as an ACCESS REQUEST. Since no hidden refresh is pending in the DRAM, the asynchronous ACCESS REQUEST event is immediately executed as the ACCESS EXECUTE assertion of WL(AD2) 30 shows. Note that the access requires the minimum memory cell access cycle time for the DRAM core shown as the DRAM row access time plus the row pre-charge time, or $T_{ras}+t_{rp}$. Note that in the NO HIDDEN REFRESH case, the memory access operation, whether for a read or for a write, is executed immediately.

Referring now particularly to the HIDDEN REFRESH case, an internal refresh operation is pending as the asynchronous ACCESS REQUEST is made by the transition of ADDRESS 10. The refresh will be executed as shown by the assertion of the REFRESH WL 14. Therefore, the execution of the external access, ACCESS EXECUTE, shown by the assertion of WL(AD2) is delayed by the access time $T_{ras}+t_{rp}$. It can easily be seen that the differing response of the DRAM to the SRAM compatible address command causes a problem of indefiniteness. It is not possible for the external device, such as a microprocessor, to know in advance if a data read will be valid on the first cycle or the second cycle. This causes inefficiency in data access to the DRAM device because of this unpredictability.

Figure 2:
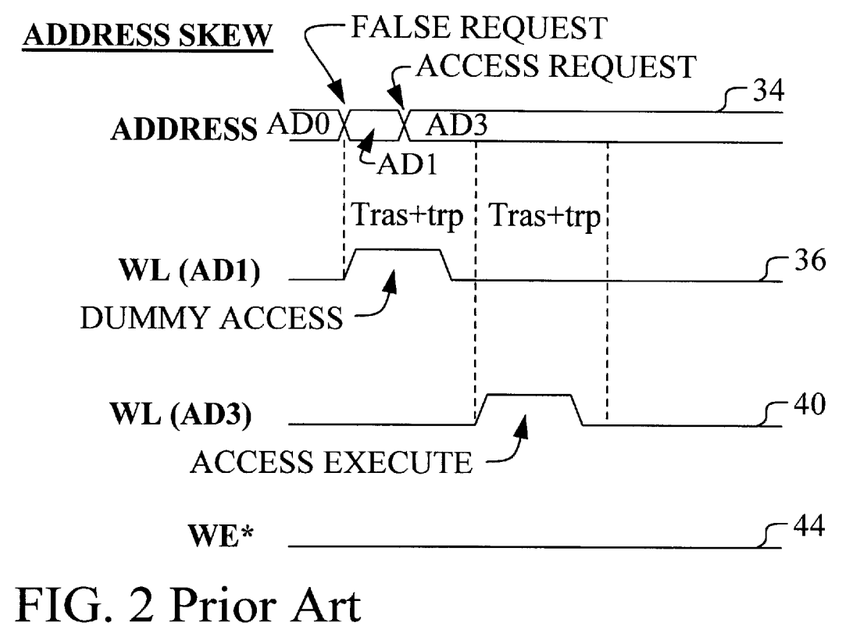
FIG. 2 illustrates the prior art DRAM using SRAM compatible signals particularly illustrating the address skew condition.

Referring now to FIG. 2, another problem with using the DRAM as a SRAM compatible substitute is illustrated. In this case, an address skew condition occurs. In particular, the address bus ADDRESS 34 transitions first to the address AD1. Then ADDRESS 34 transitions to address AD3 a very short time later. This condition is called address skew. In fact, the accessing device is making a single transition between a previous address AD0 and the final address AD3. However, individual address lines may transition to the new address state at different times, perhaps due to different line lengths or capacitance coupling. In any event, the DRAM sees a preliminary address transition to AD1 and interprets this as the beginning of an access. Note that the write enable bar line WE* 44 is in the read state. Therefore, the DRAM interprets the FALSE REQUEST as a read access of AD1. The read access of AD1 is executed in the first read cycle as the DUMMY ACCESS shown on WL(AD1) 36. When the final transition of ADDRESS 34 occurs to the address AD3, a second ACCESS REQUEST is generated. This read of AD3 is executed on the second cycle as the ACCESS EXECUTE shown on WL(AD3) 40. The ADDRESS SKEW case creates a dummy access of the DRAM that requires additional cycle time and unnecessarily consumes power.

Figure 3:
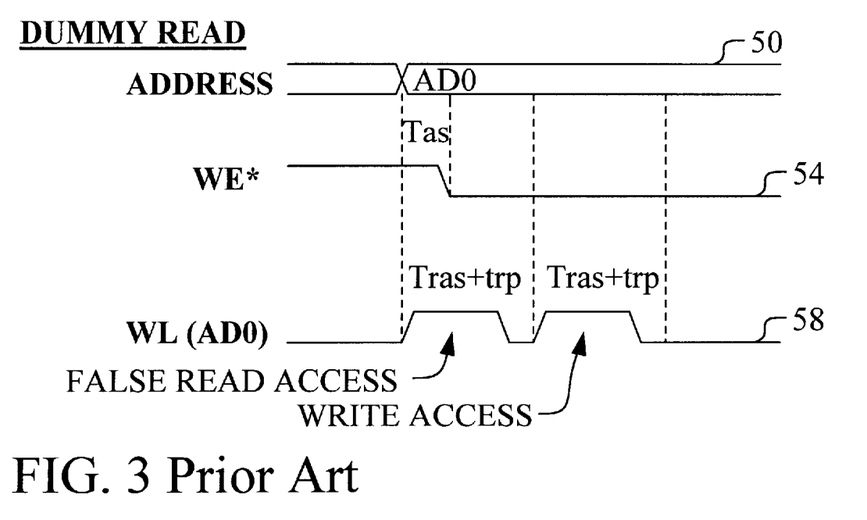
FIG. 3 illustrates the prior art DRAM particularly showing the dummy read condition.

Referring now to FIG. 3, yet another problem of the prior art usage of a DRAM in a SRAM compatible application is shown. In this case, a DUMMY READ is shown. The SRAM access specification calls for an address set up time $T_{as}$ on the ADDRESS line 50 prior to the write enable of the WE* line 54. However, the DRAM will interpret the transition of the ADDRESS line 50 to AD0 as the initiation of a read access from AD0. This access is executed in the first cycle as the FALSE READ ACCESS of WL(AD0) 58. The assertion of the WE* line 54 is interpreted as a secondary request to then write to address AD0. This WRITE ACCESS is executed in the second cycle of WL(AD0) 58. Once again, the performance of the memory is degraded by the inclusion of the unnecessary, and current consuming, false reads.

Several prior art inventions describe SRAM compatible DRAM methods and circuits. U.S. Pat. No. 6,028,804 to Leung discloses a circuit for creating a SRAM compatible DRAM. The circuit utilizes the access time for performing a refresh. In case of a conflict between an external access and an internal refresh, the external access is performed first. The refresh is performed second so that the external access is not delayed. U.S. Pat. No. 5,991,851 to Alwais et al describes a SRAM compatible DRAM device. A SRAM is used as a cache for the DRAM array. U.S. Pat. No. 5,999,474 to Leung et al teaches a SRAM compatible DRAM device using a SRAM cache and a DRAM array.

SUMMARY OF THE INVENTION

A principal object of the present invention is to provide an effective and very manufacturable method and circuit for internally executing an externally initiated access to a dynamic memory array including a plurality of dynamic memory cells wherein said dynamic memory cells require periodic refreshing.

A further object of the present invention is to provide a method and a circuit to make a DRAM memory array interface compatible with a SEAM memory array.

Another further object of the present invention is to provide a method and a circuit that reduces power consumption in a SRAM interface compatible DRAM memory array by eliminating dummy cycles.

Another further object of the present invention is to provide a method and a circuit that handles internal hidden memory refreshes without a throughput penalty.

Another further object of the present invention is to provide a method and a circuit that handles address skew and dummy read cycle by doing a refresh during a read/write wait time.

In accordance with the objects of this invention, a method of internally executing an externally initiated access to a dynamic memory array including a plurality of dynamic memory cells, wherein the dynamic memory cells require periodic refreshing, is achieved. The method comprises, first, determining if an external access to the dynamic memory array has been initiated. Second, a waiting period of RW idle time is inserted. The RW idle time comprises a sum of a row access time plus a pre-charge time. A pending refresh is performed during said RW idle time. A pending write access may be performed during the RW idle time. Finally, the external access is internally executed in the dynamic memory array after the RW idle time.

Also in accordance with the objects of this invention, a circuit for internally executing an externally initiated access to a dynamic memory array including a plurality of dynamic memory cells wherein the dynamic memory cells require periodic refreshing is achieved. The circuit comprises, first, a synchronizing clock generator that generates a sync clock from an external access signal. Second, a re-triggerable delay generator is included that generates a delayed sync pulse from the sync clock. The delayed sync pulse trails the sync clock by a RW idle time comprising a sum of a row access time plus a pre-charge time. Third, a read/write arbiter generating a refresh enable signal from the sync clock, the delayed sync pulse, and a refresh clock is included. The refresh enable signal is enabled during the RW idle time when the refresh clock is enabled. Fourth, a wordline control and timer circuit that generates a wordline active signal and a bitline active signal from the delayed sync pulse and the refresh enable signal is included. Finally, a row address multiplexer that selects between an externally requested address and an internal refresh address based upon the refresh enable signal is included. A pending refresh is performed during the RW idle time. The external access time to the dynamic memory array is internally executed after the RW idle.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method and a circuit to form a SRAM compatible DRAM. A method and circuit for internally executing an externally initiated access to a dynamic memory array including a plurality of dynamic memory cells, wherein the dynamic memory cells require periodic refreshing, is disclosed. It should be clear to those experienced in the art that the present invention can be applied and extended without deviating from the scope of the present invention.

Figure 4:
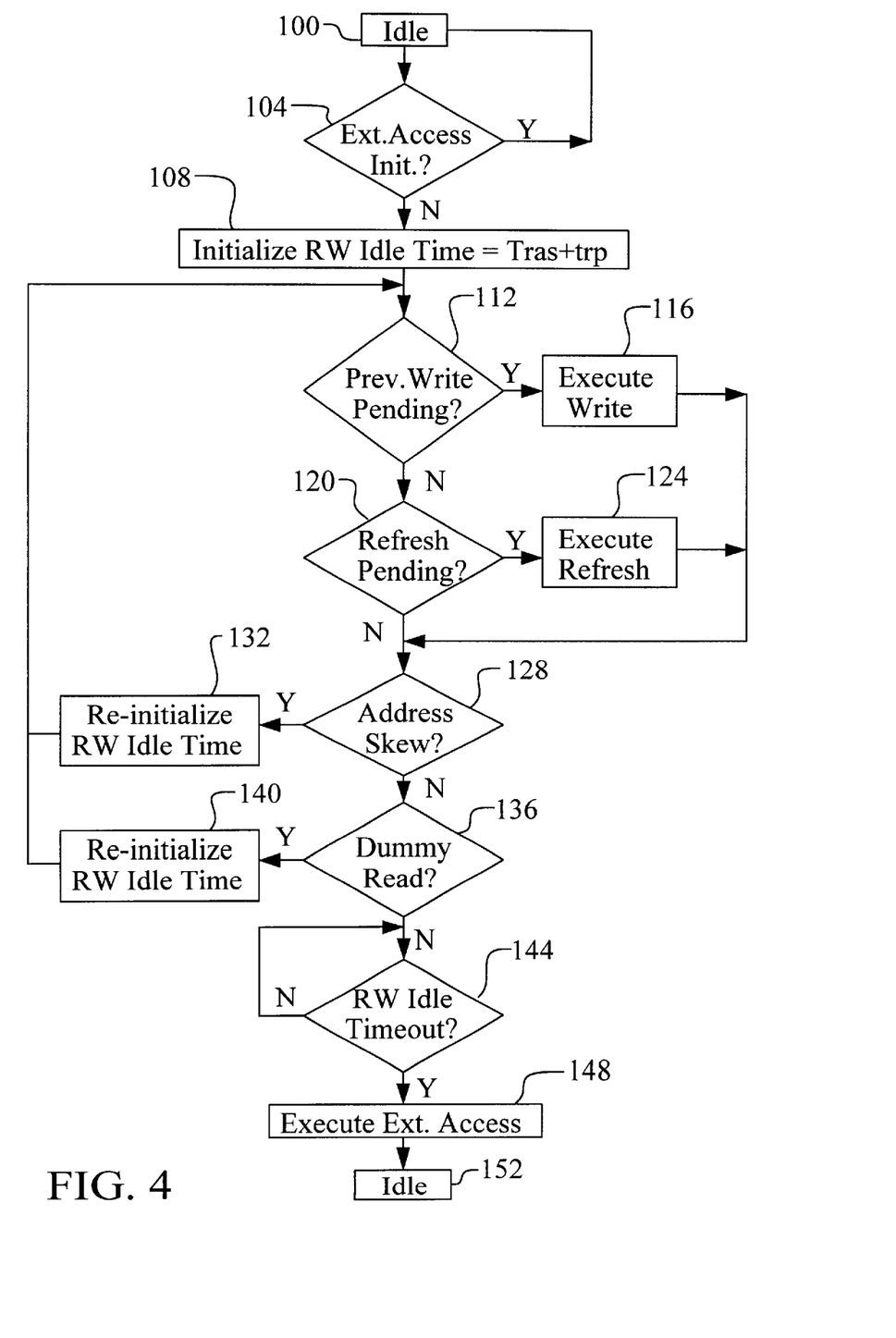
FIG. 4 illustrates the preferred embodiment method of the SRAM compatible DRAM method of the present invention.

Referring now to FIG. 4, the preferred embodiment of the method of the present invention is shown in an exemplary flow chart form. FIGS. 5 through 8 show the preferred embodiments as timing diagrams. The preferred embodiment is a method of internally executing an externally initiated access to a dynamic memory array including a plurality of dynamic memory cells, wherein the dynamic memory cells require periodic refreshing. As will be demonstrated, the method provides a SRAM compatible interface DRAM with reduced current consumption and predictable performance. Several important features of the present invention are illustrated in the figures and are discussed below.

Figure 5:
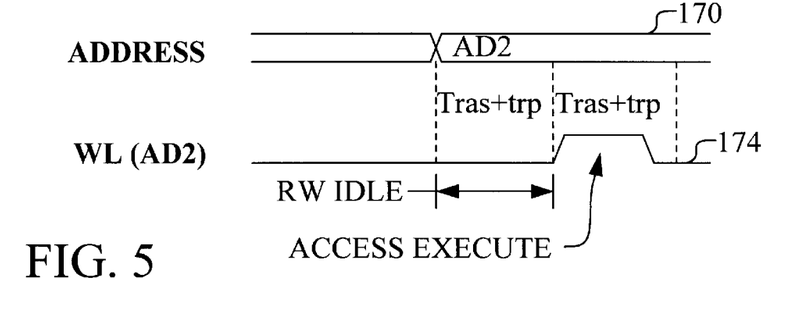
FIG. 5 illustrates the timing performance of the method of the present invention showing the read/write idle delay.

Referring again to FIG. 4, as an important feature, the method comprises, first, determining if an external access to the dynamic memory array has been initiated in steps 100 and 104. Referring to FIG. 5, an external access is initiated if, for example, the address bus ADDRESS 170 transitions. In this example, the address bus transitions to address AD2. This action is asynchronous to the DRAM device because it is not synchronized to a common system clock between the DRAM and the accessing device. Referring again to FIG. 4, as an important feature, a waiting period of RW idle time is initialized and then begins to transpire in step 108. The RW idle time comprises a sum of a row access time $T_{ras}$ for the DRAM array plus a pre-charge time $t_{rp}$ for the DRAM array. Referring again to FIG. 5, the RW IDLE time comprising $T_{ras}+t_{rp}$ is initiated with the transition of the ADDRESS bus 170.

Figure 6:
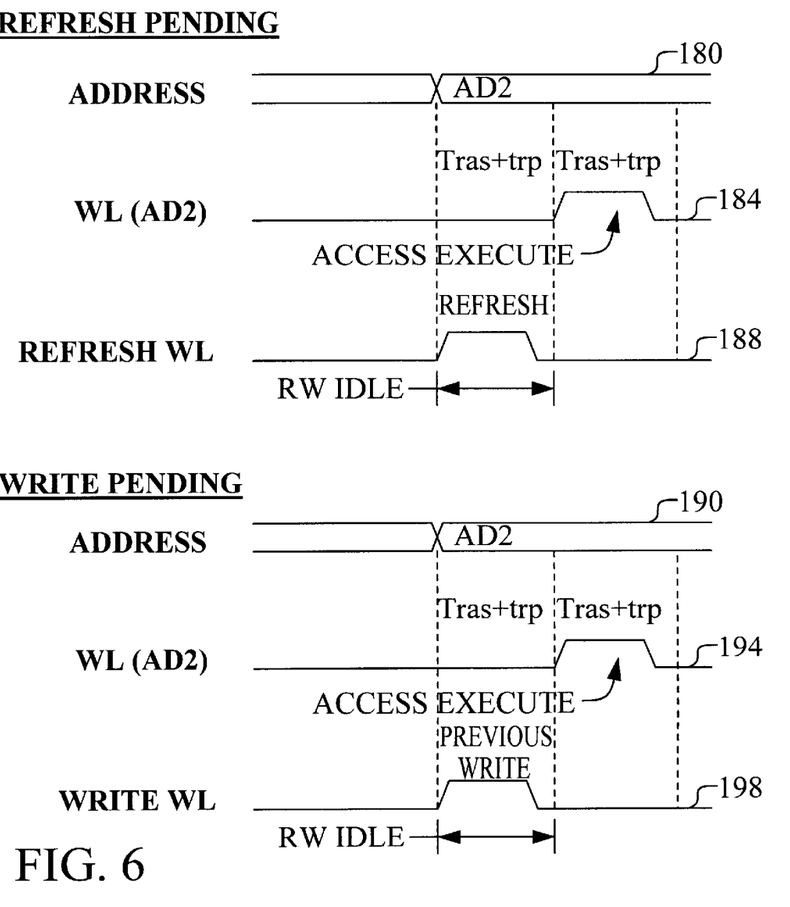
FIG. 6 illustrates the timing performance of the present invention showing a pending refresh and a pending write.

Referring again to FIG. 4, as important features, a pending refresh is performed during the RW idle time in steps 120 and 124. Referring now to FIG. 6, a condition where a memory refresh is pending is shown in the timing diagram for the present invention. The transition of the address bus ADDRESS 180 to the address AD2 initiates the access. The RW IDLE time is initiated as described above for method step 108. In this case, a refresh to of a memory location is pending. Therefore, during the RW IDLE time, the refresh is performed as shown by the REFRESH WL 188. After the RW IDLE time, the AD2 access is executed as shown by WL(AD2) 184.

Referring again to FIG. 4, alternatively, a pending write access from a previous external access may be performed during the RW idle time in steps 112 and 116. Referring again to FIG. 6, a case where a previous write is pending is shown. In this case, an external write to the DRAM has been performed at a time previous to the transition of ADDRESS 190 to the address AD2. However, this write has not yet been internally executed by the DRAM. If this case is detected, the preferred embodiment of the method of the present invention would use the RW IDLE time to execute this PREVIOUS WRITE command as shown by WRITE WL 198. Then the current external access to the DRAM initiated by the transition of ADDRESS to AD2 190 would be completed as shown by WL(AD2) 194. Note that, if a previous write command is pending, then the execution of the write command would take priority over a pending refresh as shown by FIG. 4.

Figure 7:
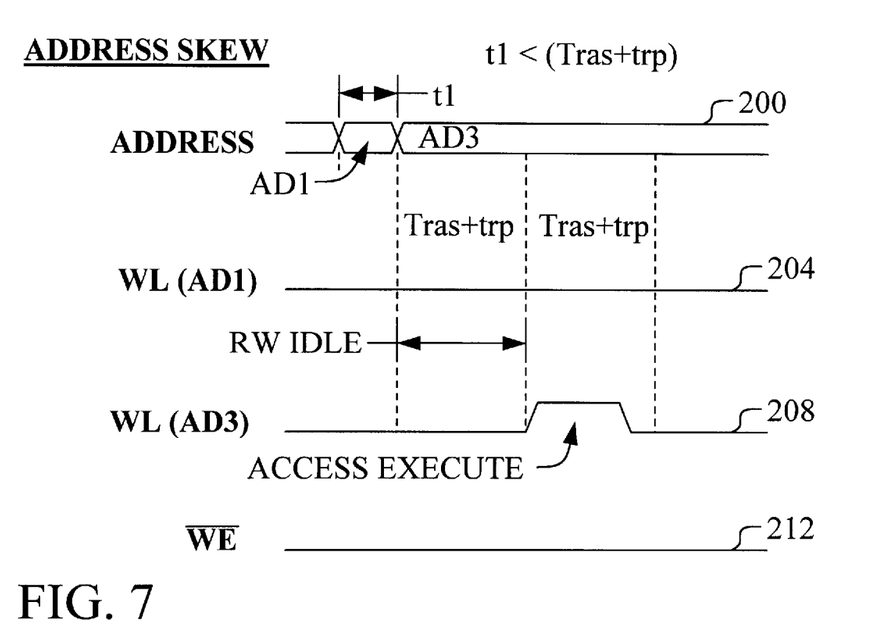
FIG. 7 illustrates the timing performance of the present invention showing an address skew condition.

Referring again to FIG. 4, if an address skew is detected in step 128, then the RW IDLE time is reinitialized in step 132. Referring now to FIG. 7, an ADDRESS SKEW is event is shown for the method of the present invention. As described in the prior art analysis, an address skew occurs when the ADDRESS bus 200 exhibits multiple transitions, in this case first to address AD1 and then to address AD3. Further, the second transition occurs at a time t1 that is less than the RW IDLE time comprising $T_{ras}+t_{rp}$. The preferred method of the present invention will detect the address skew condition and reinitialize the RW IDLE time. The first ADDRESS AD1 is thereby ignored as shown by WL(AD1) 204. The ACCESS EXECUTE for the second address AD3 is performed after the RW IDLE time as shown by WL(AD3) 208.

Figure 8:
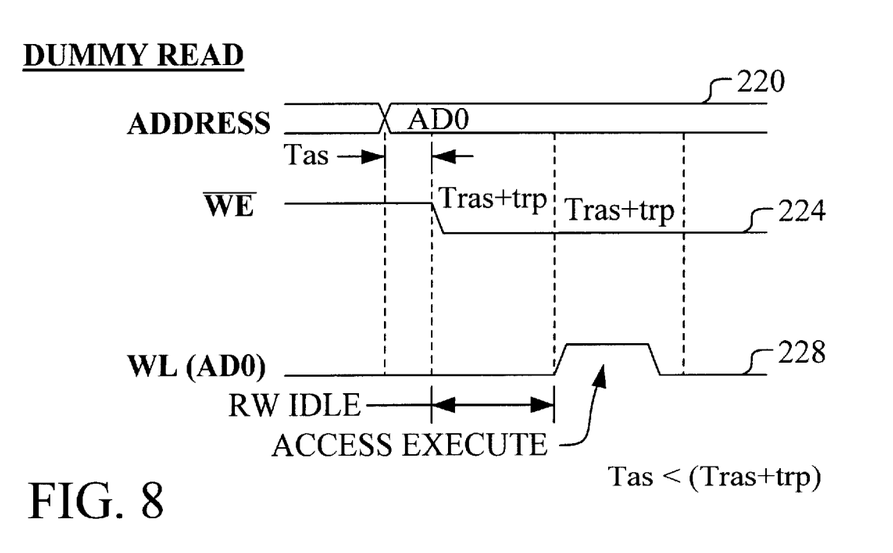
FIG. 8 illustrates the timing performance of the present invention showing a dummy read condition.

Referring again to FIG. 4, if a dummy read condition is detected in step 136, then the RW IDLE time is re-initialized in step 140. Referring now to FIG. 8, the dummy read response of the preferred embodiment method of the present invention is shown. The ADDRESS 220 transition to the new address AD0 occurs while the write enable bar (WE*) signal is in the read state due to the address set up time $T_{as}$. WE* 224 then transitions to the write state. Since the address setup time $T_{as}$ is less than the RW IDLE time ($T_{ras}+t_{rp}$), the method will detect the dummy read and re-initialize the RW IDLE time. The dummy read is thereby ignored as shown by WL(AD0) 228 during the re-initialized RW IDLE wait. The write access is then executed after the RW IDLE time as shown. The preferred embodiment of the present invention eliminates a dummy read cycle of the DRAM to prevent unnecessary power consumption. Referring again to FIG. 4, the external access that was initiated in steps 100 and 104 is internally executed in the dynamic memory array after the RW idle time in step 148. Referring again to FIG. 5, the ACCESS EXECUTE initiated by the address transition of ADDRESS 170 is performed by WL(AD2) 174 after the RW IDLE time.

Figure 9:
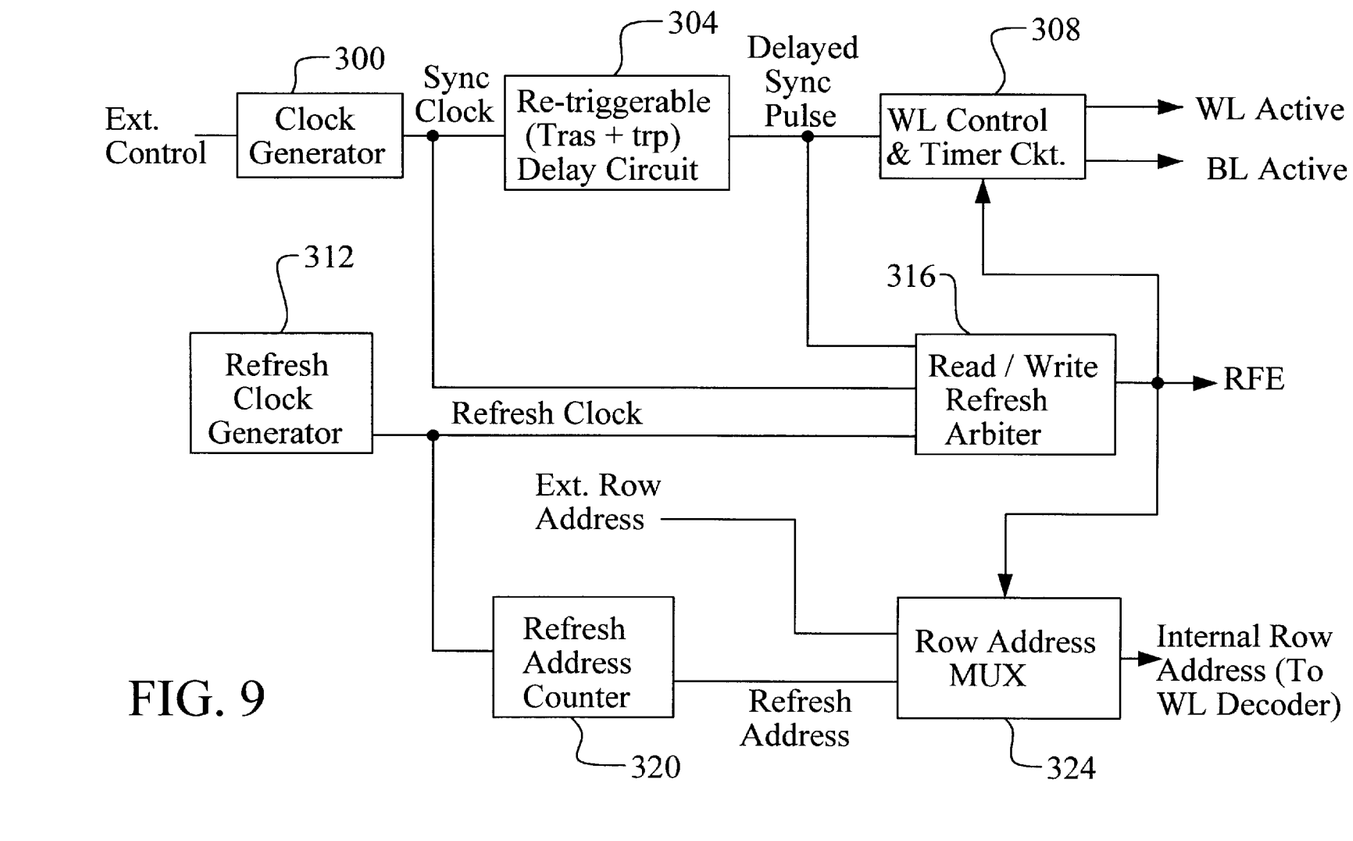
FIG. 9 illustrates the preferred embodiment method of the SRAM compatible DRAM method of the present invention.

Referring now to FIG. 9, the preferred embodiment of the circuit of the present invention is shown. The circuit comprises, first, a synchronizing clock generator 300 that generates a SYNC CLOCK from an external access signal EXT. CONTROL. Second, a re-triggerable delay generator 304 is included that generates a DELAYED SYNC PULSE from the SYNC CLOCK. The DELAYED SYNC PULSE trails the SYNC CLOCK by a RW IDLE time comprising a sum of a row access time plus a pre-charge time ($T_{ras}+t_{rp}$). Third, a read/write arbiter 316 generating a refresh enable signal RFE from the SYNC CLOCK, the DELAYED SYNC PULSE, and a REFRESH CLOCK is included. The refresh enable signal REF is enabled during the RW IDLE time when the REFRESH CLOCK is enabled. Fourth, a wordline control and timer circuit 308, that generates a wordline active (WL ACTIVE) signal and a bitline active (BL ACTIVE) signal from the DELAYED SYNC PULSE and RFE is included. Finally, a row address multiplexer 324, that selects between an externally requested EXT. ROW ADDRESS and an internal REFRESH ADDRESS based upon the refresh enable signal is included. A pending refresh is performed during the RW IDLE time. The external access to the dynamic memory array is internally executed after the RW IDLE.

Figure 10:
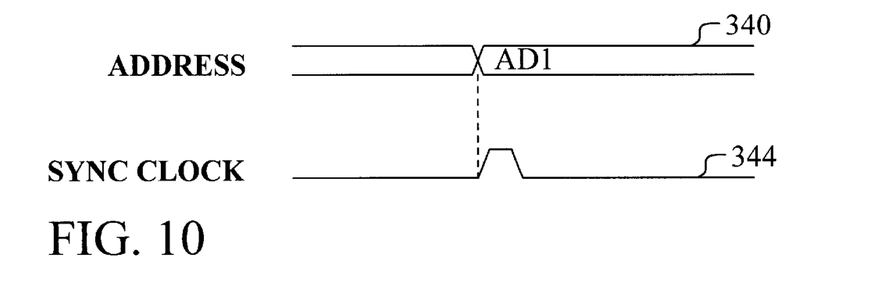
FIGS. 10 through 12 illustrate the timing performance of the preferred embodiment circuit of the present invention.
Figure 11:
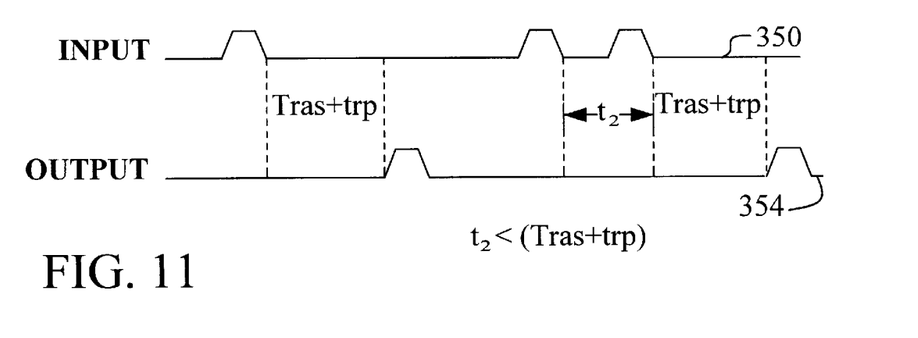
Figure 12:
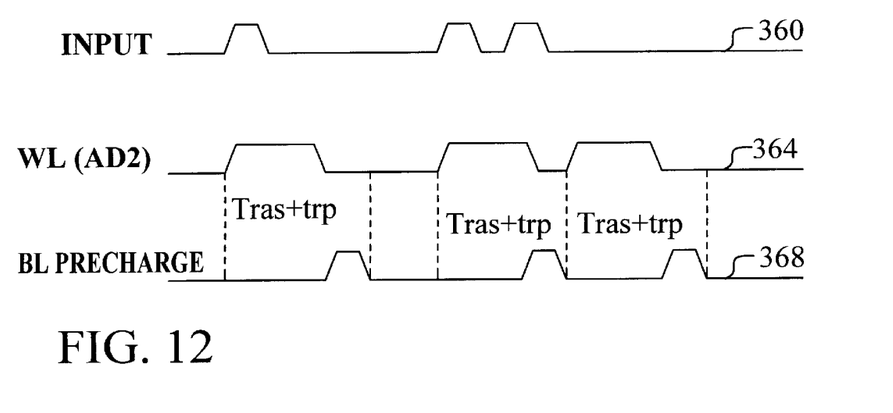

Referring now to FIG. 10, the preferred timing performance of the clock generator circuit 300 is shown. In response to the external command comprising the transition of the ADDRESS 340 to AD1, the SYNC CLOCK 344 pulses. Referring now to FIG. 11, the preferred timing performance of the re-triggerable delay circuit 304 is shown. The INPUT 350, which represents the SYNC CLOCK, creates a pulse on the OUTPUT 354 that is delayed by the RW IDLE time. Note that the OUTPUT 354, that is the DELAYED SYNC PULSE, does not pulse if a second INPUT 350 pulse occurs at $t_2$ of less than $T_{ras}+t_{rp}$. This feature facilitates filtering of address skew and dummy read conditions. Referring now to FIG. 12, the preferred timing performance of the WL control & timer circuit 308 is shown. The INPUT 360, representing a DELAYED SYNC PULSE, dictates the timing of the WL ACTIVE 364 and BL PRE-CHARGE 368 as shown.

The advantages of the present invention may now be summarized. An effective and very manufacturable method and circuit for internally executing an externally initiated access to a dynamic memory array including a plurality of dynamic memory cells, wherein said dynamic memory cells require periodic refreshing, is achieved. The method and circuit make a DRAM memory array interface compatible with a SRAM memory array. The power consumption in a SRAM interface compatible DRAM memory array is reduced by eliminating dummy cycles. Internal hidden memory refresh is handled without a throughput penalty. Address skew and dummy read cycle are correctly handled by doing a refresh during a read/write wait time.

As shown in the preferred embodiments, the novel method and circuit for internally executing an externally initiated access to a dynamic memory array including a plurality of dynamic memory cells wherein said dynamic memory cells require periodic refreshing provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method of internally executing an externally initiated access to a dynamic memory array including a plurality of dynamic memory cells wherein said dynamic memory cells require periodic refreshing, said method comprising:

determining if an external access to said dynamic memory array has been initiated;

thereafter waiting a RW idle time wherein said RW idle time comprises a sum of a row access time plus a pre-charge time and wherein a pending refresh is performed during said RW idle time and further comprising:

detecting an address skew comprising said external access initiated by a transition of an address bus and said address bus changing state during said step of waiting a RW idle time; and restarting said step of waiting a RW idle time each time said address skew is detected; and restarting said step of waiting a RW idle time when a dummy read is detected; and thereafter internally executing said external access to said dynamic memory array.

2. The method according to claim 1 further comprising internally executing a previous external write during said RW idle time wherein said previous external write was initiated prior to said external access.

3. The method according to claim 1 wherein said method is compatible with a standard method of externally accessing an asynchronous static memory array including a plurality of static memory cells wherein said static memory cells do not require periodic refreshing.

4. The method according to claim 1 wherein said method is internally synchronized to said external access and not to an internal clock.

5. The method according to claim 1 further comprising internally executing a previous external write during said RW idle time wherein said previous external write was initiated prior to said external access.

6. The method according to claim 1 further comprising:

detecting a dummy read comprising said external access initiated by a transition of an address bus and a write enable signal changing from a read state to a write state during said step of waiting a RW idle time; and restarting said step of waiting a RW idle time when said dummy read is detected.

7. The method according to claim 6 further comprising internally executing a previous external write during said RW idle time wherein said previous external write was initiated prior to said external access.

8. A method of internally executing an externally initiated access to a dynamic memory array including a plurality of dynamic memory cells wherein said dynamic memory cells require periodic refreshing, said method comprising:

determining if an external access to said dynamic memory array has been initiated;

thereafter waiting a RW idle time wherein said RW idle time comprises a sum of a row access time plus a pre-charge time and wherein a pending refresh is performed during said RW idle time and further comprising:

detecting a dummy read comprising said external access initiated by a transition of an address bus and a write enable signal changing from a read state to a write state during said step of waiting a RW idle time; and restarting said step of waiting a RW idle time when said dummy read is detected; and thereafter internally executing said external access to said dynamic memory array.

9. The method according to claim 8 further comprising internally executing a previous external write during said RW idle time wherein said previous external write was initiated prior to said external access.

10. The method according to claim 8 wherein said method is compatible with a standard method of externally accessing an asynchronous static memory array including a plurality of static memory cells wherein said static memory cells do not require periodic refreshing.

11. The method according to claim 8 wherein said method is internally synchronized to said external access and not to an internal clock.

12. A circuit for internally executing an externally initiated access to a dynamic memory array including a plurality of dynamic memory cells wherein said dynamic memory cells require periodic refreshing, said circuit comprising:

a synchronizing clock generator that generates a sync clock from an external access signal;

a re-triggerable delay generator that generates a delayed sync pulse from said sync clock wherein said delayed sync pulse trails said sync clock by a RW idle time comprising a sum of a row access time plus a pre-charge time;

a read/write arbiter generating a refresh enable signal from said sync clock, said delayed sync pulse, and a refresh clock wherein said refresh enable signal is enabled during said RW idle time when said refresh clock is enabled;

a wordline control and timer circuit that generates a wordline active signal and a bitline active signal from said delayed sync pulse and said refresh enable signal; and a row address multiplexer that selects between an externally requested address and an internal refresh address based upon said refresh enable signal wherein a pending refresh is performed during said RW idle time and wherein said external access time to said dynamic memory array is internally executed after said RW idle.

13. The circuit according to claim 12 wherein a previous external write is internally executed during said RW idle time if said previous external write was initiated prior to said external access.

14. The method according to claim 12 wherein said circuit is compatible with a standard method of externally accessing an asynchronous static memory array including a plurality of static memory cells wherein said static memory cells do not require periodic refreshing.

15. The circuit according to claim 12 wherein said RW idle time is restarted by the detection of an address skew comprising said external access initiated by a transition of an address bus and said address bus changing state during said RW idle time.

16. The circuit according to claim 15 wherein a previous external write is internally executed during said RW idle time if said previous external write was initiated prior to said external access.

17. The circuit according to claim 12 wherein said RW idle time is restarted by the detection of a dummy read comprising said external access initiated by a transition of an address bus and a write enable signal changing from a read state to a write state during said step of waiting a RW idle time.

18. The circuit according to claim 17 wherein a previous external write is internally executed during said RW idle time if said previous external write was initiated prior to said external access.

19. The circuit according to claim 12 wherein said RW idle time is restarted by the detection of an address skew comprising said external access initiated by a transition of an address bus and said address bus changing state during said RW idle time and wherein said RW idle time is restarted by the detection of a dummy read comprising said external access initiated by a transition of an address bus and a write enable signal changing from a read state to a write state during said step of waiting a RW idle time.

* * * * *